United States Patent [19]
Laine et al.

[11] Patent Number: 5,616,958
[45] Date of Patent: Apr. 1, 1997

[54] ELECTRONIC PACKAGE

[75] Inventors: Eric H. Laine, Binghamton; James W. Wilson, Vestal, both of N.Y.

[73] Assignee: International Business Machines Corporation, Armonk, N.Y.

[21] Appl. No.: 378,347

[22] Filed: Jan. 25, 1995

[51] Int. Cl.$^6$ .................... H01L 23/34; H01L 23/495; H01L 23/48
[52] U.S. Cl. .................... 257/717; 257/673; 257/700; 257/738; 257/778; 257/779; 257/783; 257/786
[58] Field of Search .................... 257/717, 706, 257/700, 703, 784, 792, 772, 778, 779, 737, 738, 783, 786, 780, 673, 675, 773, 713, 796, 668, 672, 705

[56] References Cited

U.S. PATENT DOCUMENTS

| | | | |
|---|---|---|---|
| 4,372,037 | 2/1983 | Scappe et al. | 257/703 |
| 4,396,936 | 8/1983 | McIver et al. | |
| 4,574,330 | 3/1986 | Cohen et al. | |
| 4,941,067 | 7/1990 | Craft. | |
| 5,019,941 | 5/1991 | Craft. | |
| 5,075,759 | 12/1991 | Moline | 257/712 |
| 5,172,303 | 12/1992 | Bernardoni et al. | 257/686 |
| 5,280,409 | 1/1994 | Selna et al. | |
| 5,285,352 | 2/1994 | Pastore et al. | |
| 5,352,926 | 10/1994 | Andrews | 257/778 |
| 5,381,039 | 1/1995 | Morrison | 257/778 |

FOREIGN PATENT DOCUMENTS

| | | | |
|---|---|---|---|
| 3115017 | 4/1982 | Germany. | |
| 56-71926 | 6/1981 | Japan | 257/697 |
| 57-69765 | 4/1982 | Japan | 257/675 |
| 59-207646 | 11/1984 | Japan | 257/717 |
| 59-207616 | 11/1984 | Japan | 257/717 |
| 88/07761 | 10/1988 | WIPO | 257/675 |

OTHER PUBLICATIONS

IBM Technical Disclosure Bulletin vol. 34, No. 4B, Sep. 1991, "Thermal Carrier For Power Applications", by Laboy et al.
IBM TDB vol. 19, No. 11, Apr. 1977, "Heat Dissipation From IC Chips Through Module Package".
IBM TDB vol. 31, No. 6, Nov. 1988, "Heat Sink Assembly For Tab-Mounted Devices", by Curtis et al.

*Primary Examiner*—Mashid D. Saadat
*Assistant Examiner*—Jhihan B. Clark
*Attorney, Agent, or Firm*—Lawrence R. Fraley

[57] ABSTRACT

An electronic package which includes a thermally conductive, e.g., copper, member having a thin layer of dielectric material, e.g., polyimide, on at least one surface thereof. On the polyimide is provided the desired high density circuit pattern which is electrically connected, e.g., using solder or wirebonds, to the respective contact sites of a semiconductor chip. If wirebonds are used, the copper member preferably includes an indentation therein and the chip is secured, e.g., using adhesive, within this indentation. If solder is used to couple the chip, a plurality of small diameter solder elements are connected to respective contact sites of the chip and to respective ones of the pads and/or lines of the provided circuit pattern. Significantly, the pattern possesses lines and/or pads in one portion which are of high density and lines and/or pads in another portion which are of lesser density. The chip is coupled to the higher density portion of the circuitry which then may "fan out" to the lesser (and larger) density lines and/or pads of the other portion of the circuitry. The resulting package is also of a thin profile configuration and particularly adapted for being positioned on and electrically coupled to a PCB or the like substrate having conductors thereon.

23 Claims, 3 Drawing Sheets

ELECTRONIC PACKAGE

TECHNICAL FIELD

The invention relates to electronic packages and particularly to such packages which utilize at least one semiconductor device (chip) as part thereof.

BACKGROUND OF THE INVENTION

Electronic packages of the type described above, and particularly those which are especially adapted for use in information handling systems (computers), are well known in the art. Typically, these packages include some type of substrate (e.g., ceramic or fiberglass-reinforced epoxy) with the semiconductor chip electrically coupled thereto. The usual forms of such coupling are wirebonding (a plurality of gold wires interconnect contact sites on the chip to respective conductors on the substrate), thermocompression bonding (where heat and pressure is applied to bond two elements, e.g., projecting leads from a thin film flexible circuit and the respective chip contact sites, to thereby form an interdiffusion bond between these elements along a common interface) and soldering (wherein solder elements, e.g., spherical balls, are used to couple the chip's contact sites directly to the substrate's conductors or to leads on an interim thin film flexible circuit which is then electrically coupled to the substrate).

It is, of course, a key objective of all electronic package manufacturers to produce smaller and smaller (higher density) packages which are still capable of increased capacity over previous structures. At least two concerns arise when attempting such miniaturization, particularly when considering that increased operational demands on such devices as semiconductor chips results in such chips operating at greater and greater temperatures. To prevent package breakdown as a result of possible chip failure, providing adequate, effective heat sinking for the chip is absolutely necessary. A second concern involves circuit density and particularly the ability to increase such density and yet provide effective connections between all of the conductors (substrate and chip) which form part of the package's electrical circuitry.

In the manufacture of electronic packages, one known and accepted process used to provide the metallic portions which will eventually form part of the electrical circuitry is sputtering, wherein ions from a plasma bombard a "source", e.g., copper plate, such that atoms removed from the source are deposited onto the substrate base material, e.g., a thin polyimide layer located on a ceramic base. Often, an interim metal, e.g., chromium, is initially deposited, with the sputtered copper then deposited thereon. This chromium, designed primarily for providing increased adhesion of the copper, is also preferably sputtered. A second layer of chromium may also be deposited onto the deposited copper, also preferably using a sputtering operation. Sputtering is particularly desirable as a manufacturing process for forming electrical circuitry because of the ability to form extremely thin, uniform lines and pads of high density. By the term high density as used herein is understood to mean, with respect to circuit lines, the number of lines on the substrate's surface per linear inch, and, with respect to conductor pads or sites, the respective diameters or widths of the pads and the center-to center spacing between such pads.

As is known, sputtering results in the generation of relatively large amounts of heat from the base member receiving the sputtered atoms should the sputtering process be utilized at mass production rates demanded in today's computer field. Accordingly, the substrate material must be capable of withstanding such temperatures. Acceptable materials for such substrates have included, primarily, ceramics and the like, whereas materials such as fiberglass-reinforced epoxies (also known in the industry as FR4) are not considered acceptable due to the inability thereof to accept such increased temperatures, e.g., sometimes in excess of 400° Celsius (C.), at typical mass production rates. Sputtering is an accepted process in the production of known packages using a ceramic substrate with a thin polyimide layer thereon (a thin layer of polyimide is capable of withstanding high production temperatures) and the circuitry formed on the polyimide, the resulting packages known as multilayered ceramic packages (MCPs).

Various electronic packages are illustrated in the following U.S. Pat. Nos.: U.S. Pat. No. 4,396,936 (McIver et al); U.S. Pat. No. 4,574,330 (Cohen et al); U.S. Pat. No. 4,941,067 (Craft); U.S. Pat. No. 5,019,941 (Craft); U.S. Pat. No. 5,280,409 (Selna et al); and U.S. Pat. No. 5,285,352 (Pastore et al). Such packages are also illustrated in the following International Business Machine's Technical Disclosure Bulletin (TDB) articles: (1) vol. 19, no. 11, April 1977 at pages 4165 and 4166; (2) vol. 31, no. 6, November 1988 at pages 372 and 373; and (3) vol. 34, no. 4B, September, 1991 at pages 408 and 409. Attention is also directed to German Offenlegungsschrift DE 31 15017 (November 1982). The packages as described in these publications, however, do not appear to adequately address the provision of high density circuitry on a base substrate other than ceramic or the like inorganic materials in which effective heat removal (sinking) is assured. Most particularly, none appear to teach such packages wherein the circuitry may be formed using a high temperature operation such as sputtering. Still further, none appear to teach use of a substrate comprised of a material having a coefficient of thermal expansion (CTE) that approximates that of the circuit member, e.g., printed circuit board (PCB), on which the substrate is positioned. Provision of both substrate and PCB with substantially similar CTEs significantly reduces stresses that may occur at the interface between these two members resulting from application of heat to the interface (e.g., to effect solder reflow). Understandably, significantly different rates of expansion at this location of the package could damage solder or similar type connections, and possibly render the package inoperative.

It is believed that an electronic package and process for producing same wherein the package provides effective heat removal and also possesses high density circuitry would constitute a significant advancement in the art. It is further believed that such an advancement would be forthcoming if such a process can be taught which is readily adaptable to mass production to thereby result in a finished end product which is relatively inexpensive in comparison to many known products of this type.

OBJECTS AND SUMMARY OF THE INVENTION

It is, therefore, a main object of the present invention to enhance the electronic packaging art by providing a package (and method for making same) which possesses the several unique advantages described herein or discernable from the following teachings.

It is a more particular object of the invention to provide such a package which utilizes a base member other than ceramic and yet is capable of being produced at mass production rates using processes such as sputtering wherein relatively high temperatures are generated.

As understood from the following, it is also an object of the invention to provide such a package which, in addition to possessing high density circuitry, also possesses a thin profile (thickness) when positioned on and electrically coupled to an accommodating substrate, e.g., PCB.

It is an even more particular object of the invention to provide such an electronic package which is readily capable of being electrically connected to the accommodating substrate's circuitry using solder members.

In accordance with one aspect of the invention, there is provided an electronic package adapted for being electrically coupled to an electronic substrate, e.g., PCB, wherein the package comprises a thermally conductive member, a thin dielectric layer of organic material positioned on the thermally conductive member, at least one layer of electrical circuitry positioned on the thin dielectric layer and including a first portion having a first circuit density and a second portion including a second circuit density less than the first density, a semiconductor device positioned relative to the first portion of the electrical circuitry and electrically coupled to the first portion, and a plurality of electrically conductive members positioned in a predetermined pattern relative to the second portion of the electrical circuitry and electrically coupled to the second portion. The electrically conductive members are adapted for being electrically coupled to the electronic structure when the electronic package is positioned on the structure.

In accordance with another aspect of the invention, there is provided an electronic package assembly comprising a thermally conductive member, a thin dielectric layer of organic material positioned on the thermally conductive member, at least one layer of electrical circuitry positioned on the thin dielectric layer and including a first portion having a first circuit density and a second portion including a second circuit density less than the first density, a semiconductor device positioned relative to the first portion of the electrical circuitry and electrically coupled to the first portion, a plurality of electrically conductive members positioned in a predetermined pattern relative to the second portion of the electrical circuitry and electrically coupled to the second portion, and an electronic structure including a plurality of conductors, selected ones of the electrically conductive members being electrically coupled to respective ones of the conductors.

In accordance with another aspect of the invention, there is provided a method for making an electronic package wherein the method comprises the steps of providing a thermally conductive member, providing a thin dielectric layer of organic material on the thermally conductive member, providing a layer of electrical circuitry on the thin dielectric layer wherein the circuitry includes a first portion having a first circuit density and a second portion having a second circuitry density less than the first density, electrically coupling a semiconductor device to the first portion of the electrical circuitry, and electrically coupling a plurality of electrically conductive members to the second portion of the electrical circuitry.

BEST MODE FOR CARRYING OUT THE INVENTION

For a better understanding of the present invention, together with further and other objects, advantages, and capabilities thereof, reference is made to the following disclosure and appended claims in connection with the above-described drawings.

Figure 1:
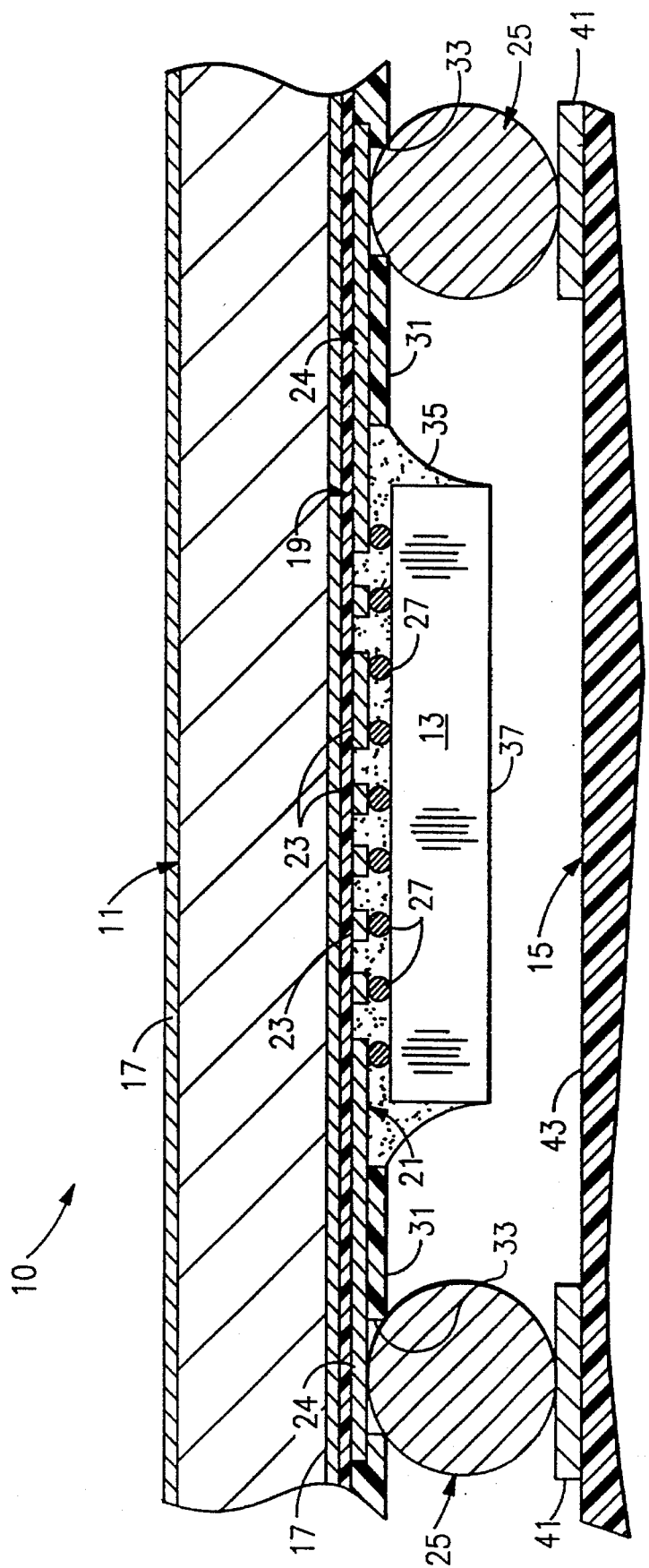
FIG. 1 is a much enlarged, partly sectioned elevational view of an electronic package (and one example of an electronic structure on which the package may be positioned) in accordance with one embodiment of the invention.

In FIG. 1 there is shown an electronic package 10 in accordance with one embodiment of the invention. Package 10 includes a thermally conductive, substantially planar member 11, which, in a preferred embodiment, is comprised of copper or aluminum or alloys thereof. Member 11 may assume at least two configurations, depending on the chosen approach for coupling the invention's semiconductor device (chip) 13 (13' in FIG. 2) to the invention's conductive circuitry (defined below). Member 11 is preferably provided in much larger size relative to the chip than partially shown in FIGS. 1 and 2 such that several (e.g., twelve) packages each including one chip 13 (or 13') can be produced in a simultaneous manner. This feature is considered particularly significant regarding packages of this type and of course contributes substantially to reducing the overall costs of each final package. In one example, a rectangular copper sheet having a thickness of about 0.64 cms (centimeters) and side and length dimensions of 9.10 cms by 12.70 cms can be provided, so as to produce the aforementioned twelve single chip packages such as package 10 therefrom. The sheet, having all chips (and circuitry and other elements, as explained below) positioned thereon and electrically coupled to respective circuitry, can then be cut (divided) into individual package structures, each having substantially rectangular configurations with side and length dimensions of 2.70 cms and 2.90 cms, respectively. Each such structure is not limited to only a singular chip, it being readily possible to have a greater number of chips per package, using the teachings herein.

Package 10 is designed for being mounted on and electrically coupled to an electronic structure such as a printed circuit board (PCB) 15, to thereby form a larger electronic package assembly. Package 10, in such mounted form, may possess a height of only about 0.15 cms above the upper surface of the board, to thereby present a thin, low profile on board 15. Understandably, such a feature contributes significantly to miniaturization efforts with respect to such packages.

Member 11 serves as a stiffener for package 10 and, if desired, may also serve as either a floating or coupled ground plane. Further description will be provided below. Significantly, if copper is used for member 11, this material will possess a CTE which approximates that of a multilayered printed circuit board such as 15. Typically, most PCBs include several conductive (e.g., copper) layers therein which function as signal, power and/or ground planes for the board. Because of the high presence of copper, the board typically possesses a CTE close to that of copper. Accordingly, the invention assures a substantial match in CTEs between the member 11 and corresponding structure (PCB 15) on which package 10 is positioned and electrically coupled. This represents a significant feature of the invention because it serves to substantially reduce the occurrence of relatively high stresses at the bond locations between package and PCB. In the case of the present invention, such bond locations involve the use of electrically conductive members 25 which, in a preferred embodiment, are solder balls. A preferred solder for members 25 is 10:90 tin:lead solder, a known solder material in the packaging art. Understandably, similar CTEs between member 11 and board 15 significantly reduces stresses on the solder balls 25 during package operation and/or assembly (wherein heat is often applied, e.g., to reflow various solder structures).

In a preferred embodiment, member 11 includes a thin layer of metal 17 on opposite surfaces thereof. (This is also shown for the embodiment in FIG. 2). Preferably, chromium is the metal for this layer and is deposited preferably using electroplating. In one embodiment, layers 17 each may possess a thickness of about 0.20 mils. (A mil is understood to comprise one one/thousandth of an inch.)

Figure 2:
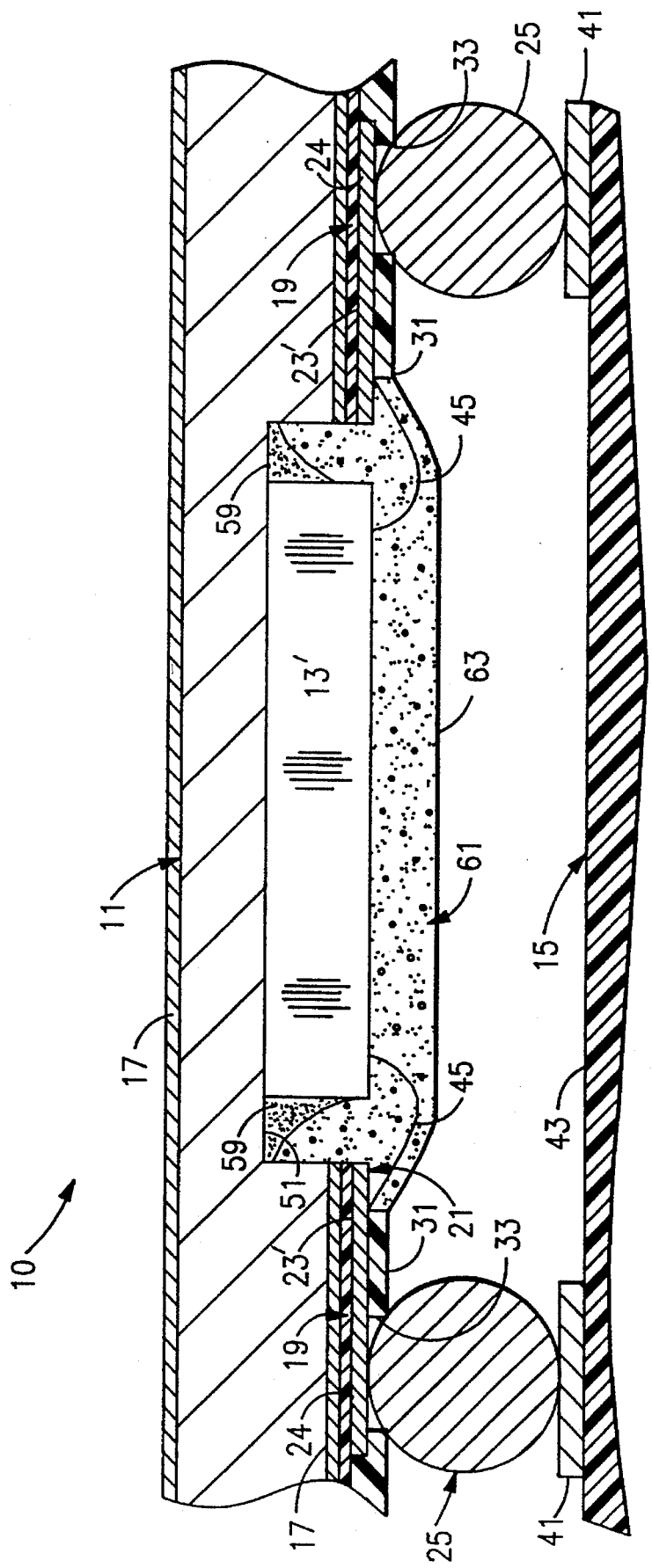
FIG. 2 is a similar view as FIG. 1 but of another embodiment of the invention.
Figure 3:
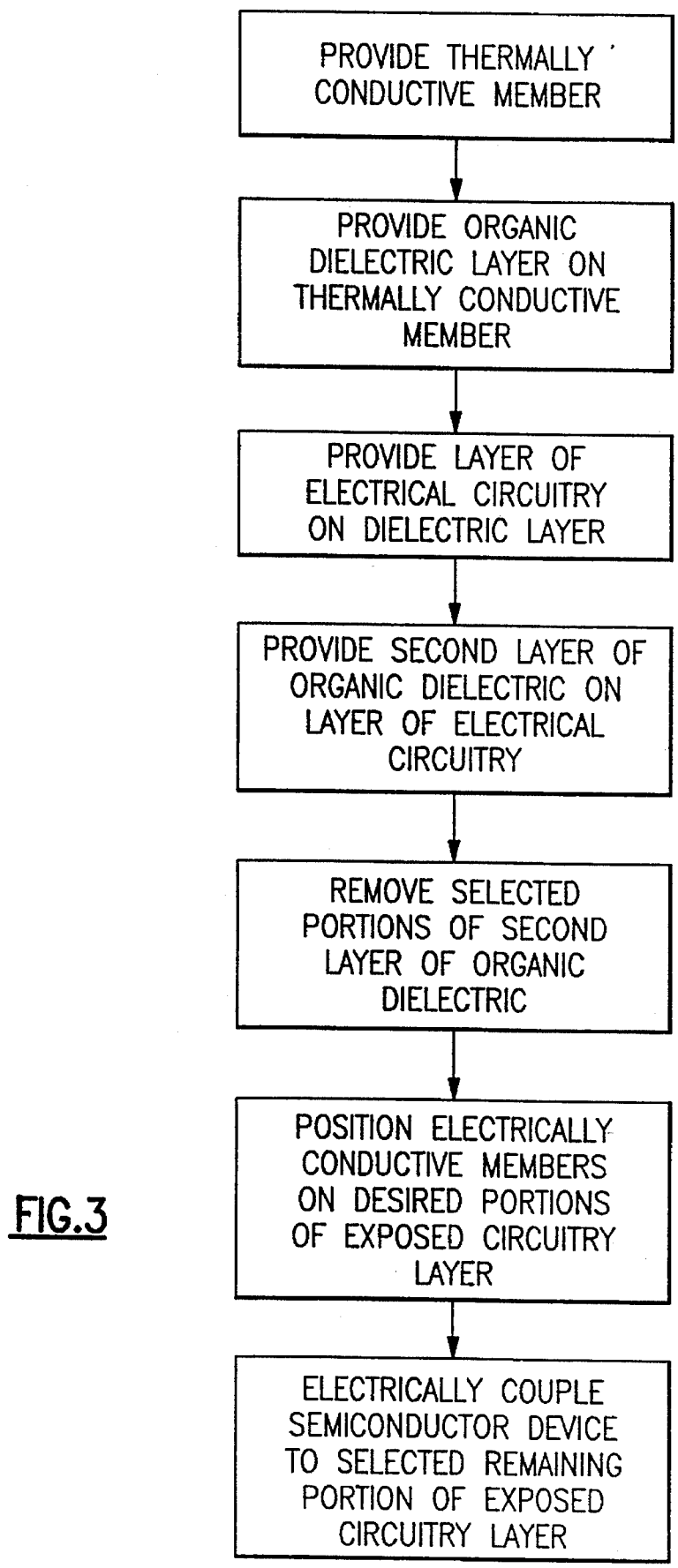
FIG. 3 is a flow diagram of a process for making an electronic package in accordance with one embodiment of the invention.

As seen in FIGS. 1 and 2, a thin dielectric layer 19 of organic material is applied onto the chromium layer 17 along the undersurface of member 11. In a preferred embodiment, dielectric layer 19 is polyimide and is applied using a spraying operation. The polyimide thickness is only 0.30 mils. After spraying, the material is dried for about 15 minutes at 100° C. The material is then cured at 365° C. for several hours.

Thin dielectric layer 19, as understood, will serve as a base layer on which the invention's single layer of circuitry is provided. This circuitry, represented by the numeral 21 in FIGS. 1 and 2, is comprised initially of chromium-copper-chromium and it is deposited atop layer 19 using a known sputtering process, such as described above. In this process, the three layers of metal are applied sequentially in a single vacuum operation. Typical thicknesses are 800 Angsttoms of chromium, 80,000 Angsttoms of copper and 800 Angstroms of chromium.

In the embodiment of FIG. 1, circuitry 21 is shown to include a plurality of relatively small conductors 23 at the portion of circuitry 21 adjacent chip 13, and substantially wider conductors 24 at the relatively extreme right and left sides of the package as seen in FIG. 1.

Significantly, circuitry 21, on both the FIG. 1 and FIG. 2 embodiments, comprises a first portion having a first circuit density and a second portion having a second, lesser density than that of the circuitry's first portion. In the embodiment of FIG. 1, this first portion of higher density includes conductors 23 which, as shown, are designed for being directly coupled to chip 13 using an interim array of solder elements 27. In comparison, the conductors 24 located at the outer portions of the layer of circuitry 21 are shown to be somewhat wider than conductors 23. These conductors, while of a substantially similar thickness and provided simultaneously with the remainder (conductors 23) of circuitry 21, are of a lesser circuit density than that portion of the circuitry possessing the more closely spaced conductors 23. In one example, the conductors 23 in this first portion of circuitry 21 comprised a grouping of pads and were of substantially cylindrical configuration possessing a diameter of only about 3.5 mils. These pad conductors were spaced at an average distance from one another (pitch) at about 9 mils (center-to-center). In comparison, the associated pads 24 located at the outer portions of circuitry 21 were also of substantially cylindrical configuration and each possessed a diameter of about 16 mils. The desired pitch (center-to-center) of these conductors was about 50 mils. Should the first portion of circuitry possessing conductors 23 be comprised of lines and not pads, it is preferred that this density be from about 500 to 600 lines per inch. That is, each line possesses a width of about 0.7 mils and the lines are spaced apart on 1.80 mil center-to-center spacings. Should lines also be utilized for the outer, lower density portion of circuitry 21, such lines would occupy a density of about fifty to one-hundred lines per inch. It is preferred, however, to provide pads (rectangular or cylindrical) at the circuit's outer portions because of the need to electrically couple these elements to the substantially larger solder conductive members 25.

In FIG. 1, chip 13 includes a plurality of contact sites (not shown) which are each electrically coupled to a respective conductor 23 (or to a common conductor, e.g., ground) using the illustrated solder elements In a preferred embodiment, solder elements 27 were of spherical ball configuration and comprised of 3:97 tin:lead solder. A preferred procedure for providing coupling between the chip and circuitry is a solder reflow operation wherein the package (member 11 with chip 13 in position) is placed in an oven at a temperature of about 350° C. for a period of about 5 minutes.

Before the above occurs, however, it is desirable to firstly attach the larger, outermost solder ball members 25. Before coupling such members, it is preferred to apply a substantially continuous second thin dielectric layer of organic material 31 onto selected portions of circuitry 21 which, in the embodiment of FIG. 1, is only on the outermost portion of the circuitry having the lesser density. A preferred technique for applying material 31 is spraying and subsequent curing such as described above for layer 19. A preferred material, like that of layer 19, is polyimide. With the second polyimide in position and cured, selected holes (33) are provided in the organic material 31 at desired contact sites for receiving the solder ball members 25. A preferred technique for providing such holes 33 is to use laser ablation. In one embodiment, each hole was of substantially cylindrical configuration and possessed a diameter of only about 17 mils.

In a preferred embodiment of the structure of FIG. 1, the second layer of organic material 31 may be applied across the entire upper surface of circuitry 21. This occurs, of course, after the formation of the circuit pattern for the circuitry. Preferably, this pattern, including the inner, more dense circuit regions and the outer, less dense regions, is accomplished using known photolithography procedures. During such procedures, a photoresist material (not shown) is deposited, exposed (to expose a pattern), developed and baked. The circuit pattern is formed by etching away the exposed metal. The remaining photoresist, which protected the metal that now constitutes the circuit pattern, is then removed leaving the respective circuit elements (e.g., 23, 24) exposed. The desired pads on which the larger solder ball members 25 and the much smaller solder ball elements 27 are to be coupled, are then exposed using the aforementioned laser ablation process. As understood, such laser ablation is capable of providing very small diameter openings in such organic material as polyimide. By way of example, the openings provided for conductors 23 into which the smaller solder elements 27 are positioned each possessed a diameter of only about 5 mils. It is noted in FIG. 1 that material 31 is not shown directly under chip 13 for illustration purposes.

Following provision of openings in the polyimide 31 to accommodate the respective solder ball members 25 (and, possibly, the smaller solder ball elements 27) the circuitry exposed as a result of such removal is now subjected to an etch process in which the upper chromium is removed, thereby exposing the underlying copper. It is to this copper that the solder members in FIG. 1 are directly coupled.

In the next step of the operation, the larger solder ball members 25 are coupled to the respective pads, or lines 24. If a series of packages have been simultaneously provided through the provision of a large thermally conductive member 11 and several additional chip sites and outer lead sites for each package thereon, the next preferred step in producing the package of FIG. 1 is to cut the larger copper member 11 along predetermined boundary lines to thereby produce a quantity of individual package members, each having solder ball members 25 and the circuitry with conductors 23 and 24 thereon. At this stage, it is understood that chip 13 has yet to be provided.

As stated above, a copper sheet was utilized in one example having a rectangular shape with side and length dimensions of 9.10 cms and 12.70 cms, respectively. This conductive sheet, having individual circuit patterns formed simultaneously thereon and selected quantities of larger solder ball members electrically coupled to selected parts of each of the individual circuitries, is now divided (cut) into a desired total of twelve individual packages 10. Each such package 10 preferably includes a plurality (e.g., 432) of the larger 10:90 tin:lead solder members 25 designed for accommodating a singular chip. In this example, solder members 25 may possess a diameter of only 30 mils, while the corresponding solder elements 27 may possess a diameter of only 4 mils.

In the next preferred step for making the package of FIG. 1, chip 13, including the designated plurality of smaller solder elements 27 thereon, is aligned with and electrically coupled to (using solder reflow) the respective, high density conductors 23 at the inner, first portion of the invention's circuitry. This solder reflow occurs at a temperature of about 315° C. and, significantly, does not adversely affect the already soldered members 25.

Following reflow of solder elements 27, it is preferred to apply a quantity of encapsulant 35 substantially about chip 13, including under the chip to substantially surround the formed solder connections. As seen in FIG. 1, encapsulant 35 only substantially engages the sides of the chip and the bottom surface (having the contact sites). Encapsulant is not positioned on the exposed, outer surface 37 of chip 13. A preferred encapsulant material is Hysol 4511, available from Hysol Electronic Chemicals, Olean, N.Y. (Hysol is a trademark of Hysol Electronic Chemicals.)

Package 10 is then substantially complete and adapted for being positioned on and electrically coupled to the corresponding electronic structure (PCB 15). This connection can be simply accomplished using pick and place equipment which precisely positions the package 10 in alignment with PCB 15 such that the solder ball members 25 are precisely aligned relative to respective conductor pads 41 (e.g., copper pads) located on an upper surface 43 of PCB 15. In one embodiment of the invention, the aforementioned total of 432 solder ball members 25 were used to mate with a corresponding, similar number of conductor pads 41. When assembled onto PCB 15, package 10 possesses a height from the PCB's upper surface 43 of only about 0.15 cms, thus assuring a substantially low profile package structure.

The above steps for producing the package of FIG. 1 can also include interim testing and inspection procedures which are not defined in greater detail herein because such procedures are well known in the art. One particular location for conducting such tests and inspection can be following the etching of the chromium to assure full exposure of all desired locations of the invention's single layer of circuitry which are to accommodate external conductive members such as solder members 25 and elements 27.

In the embodiment of FIG. 2, electrical coupling between the package circuitry and contact sites (not shown) on chip 13' is provided using a plurality of conductive wires 45. In a preferred embodiment, these wires are gold and possess a small diameter of only about 1.30 mils and a length of about 0.25 cms. In FIG. 2, because the protruding wires typically extend above (below in FIG. 2) the corresponding surface of chip 13', it is desired to provide an indentation or recess 51 within the copper thermally conductive member 11 such that the chip, as seen, can be substantially positioned therein. Accordingly, a low profile package structure still results.

In FIG. 2, the copper thermally conductive member 11 includes the initial chromium layer 17 along the bottom surface thereof and a thin dielectric layer of organic material 19 as was provided in FIG. 1. The deposition of both layers 17 and 19 may occur following the formation of the indentation 51 in member 11. Alternatively, it is possible to provide this indentation following the application of both layers. However, the former procedure is desired to save materials.

It is particularly noted that the circuit layer which includes similar conductive members 24 as the embodiment of FIG. 1, also includes a second portion of substantially greater density than that portion occupied by the outermost conductors 24. These higher density internal conductors are represented by the numerals 23' in FIG. 2.

In one embodiment of the invention, the inner conductive members 23' (those located adjacent chip 13') included a plurality of individual pads each having a width of 4 mils. These internally located rectangular pads were spaced at a pitch of 8 mils. Each pad 23' in turn is designed for having a respective one of the gold wires 45 bonded (e.g., using thermocompression bonding) thereto. It is understood in FIG. 2 as well as FIG. 1 that the respective internal conductors 23' (FIG. 2) and 23 (FIG. 1) "fan out" to the outer, somewhat larger conductors 24. In one embodiment, for example, of the FIG. 2 structure, an array of 208 internal conductors 23' were spacedly positioned along the outer walls of the indentation 51 relative to chip 13' so as to receive the desired wires 45. Each conductor 23' is then coupled to a respective one of the outer conductors 24 which, as stated, are relatively larger in size and at a much less density than the corresponding, finer interior conductors. In the same example provided above, it is thus understood that a total of 208 outer conductors 24 may be provided, each designed for having a respective solder member 25 electrically coupled thereto.

As stated, the package of FIG. 2 also includes a layer of organic material 31 on selected portions of the underlying circuitry including conductors 24 and 23'. This layer is also provided (e.g., using laser ablation as in FIG. 1) with the illustrated openings 33 into which a respective solder ball member 25 may be located and reflowed to couple to its respective conductive member 24. This outer pattern of conductors 24 is thus substantially similar in number and configuration (rectangular) as the pattern of conductors 24 in FIG. 1.

The preferred method of forming package 10 of FIG. 2 comprises providing a thermally conductive member 11 with indentation 51 (several indentations if several packages are being simultaneously formed). The chromium layer 17 and subsequent organic material 19 is applied, following which circuitization of the invention's single layer of circuitry including the conductors 24 and 23' is provided. A second layer of dielectric organic material 31 is then added, as was done in FIG. 1. Following these operations, laser ablation is used to define the respective openings 33. Solder ball members 25 are then secured in position and coupled to the respective conductors 24. The aforementioned cutting of member 11 then occurs, if more than one package 10 are being simultaneously formed on the common member 11. Chip 13' is then bonded to member 11 using a suitable adhesive (not shown). In one example, the adhesive used was 965 IL epoxy from Ablestick Laboratories of Rancho Dominguez, Calif. This adhesive was then cured in position. A quantity of encapsulant 59 may then be applied along the sides of the chip 13' and into the indentation 51, as shown in FIG. 2. Wirebonding may then be utilized to bond the individual gold wires 45 to respective chip contact sites and respective, internal conductors 23'. Such wirebonding may be accomplished using apparatus and procedures known in the art and further definition is not provided. Following this electrical coupling, another quantity of encapsulant 61 is located over the wires and coupled chip, and, preferably, part of the high density conductors 23'. In one embodiment, the encapsulant used was Hysol 4450 available from the aforementioned Hysol Electronic Chemicals company.

As seen in FIG. 2, this second encapsulant 61 includes a substantially planar surface portion 63 which, as shown, is substantially planar to the corresponding chip 13'. In one example of the embodiment in FIG. 2, package 10 possessed a height of only about 0.15 cms from the upper surface 43 of PCB 15.

A solder reflow operation is performed to bond the larger solder ball elements 25 to respective PCB conductor pads 41. The temperatures required to perform this soldering operation do not adversely affect the wirebond chip and associated circuitry elements.

The above measurements for the respective elements used in the invention are not meant to limit the invention in any manner. Specifically, other dimensions are readily possible to still attain a successfully operating structure. For example, cylindrical pads used to form the conductive elements 23 in FIG. 1 can possess a diameter of from about 3 to about 4 mils and be spaced apart at center-to-center spacings of about 8 to about 10 mils. By way of further example, the outer conductive members 24, if also of cylindrical configuration, may possess a diameter of about 14 to 18 mils and be spaced apart at center-to-center spacings of about 40 to 55 mils. Should conductive members 23 or 23' be of rectangular shape, these may possess a width of about 3 to 5 mils and spaced apart at center-to-center spacings of about 7 to 9 mils.

It is understood that the above dimensions illustrate a preferred range of dimensions and proportional dimensions between corresponding elements and are clearly not meant to limit the invention. Such small dimensions and spacings, however, assure a pattern of internal conductive members of relatively high density as is strongly desired in the computer industry. Most significantly, these higher densities are attainable because of the ability to use a high temperature process such as sputtering. Such a process is possible without adversely affecting the underlying elements (e.g., polyimide 19).

One significant advantage of the packages shown herein is that the relatively thick copper member 11 (e.g., having a thickness in one embodiment of about 0.64 cms) is capable of functioning as both a heat sink (in both FIGS. 1 and 2 embodiments) and also to provide maximum electrical benefit to package 10 by serving either as a "floating" ground plane or a connected ground plane. A "floating" ground plane is attainable due to the minimal thickness (e.g., 0.30 mils) of the first dielectric layer of organic material 19, which serves to separate the circuitry from the conductive member 11. Most significantly, the invention allows the use of a highly desired sputtering operation in order to assure fine line circuitry at the relatively high densities taught herein. Such is possible without the use of ceramic or similar materials as used in the prior art. As stated, a sound thermal conductive material is used for member 11, this probably being copper such that it will possess a similar CTE to that of the multilayered PCB on which it is positioned. As further indicated, all of the above is attainable while still assuring a low profile package member for being positioned on an external substrate such as PCB 15.

By way of example, the following dimensions are attainable to provide package structures possessing the features described herein above. For packages having outer dimensions of 27 millimeters (min.) by 27 min., input/output (I/O) counts as high as 360 are attainable. For 35 mm. square packages, I/O counts from 440 to 560 are possible and, for square packages with 40 mm. sides, I/O counts as high as about 800 are attainable. A typical package (27 mm.) is estimated to have a power dissipation of about 2 to 4 watts. It is estimated that packages produced in accordance with the teachings herein can be used in relatively high power applications, and, if so, dissipate up to about 25 watts, provided appropriate heat sinking and air flow is provided. It is further noted that the singular layer of circuitry as taught herein does not require the provision of vias (apertures) as part of the package circuit structure. This reduces the operational steps needed to make the invention, and thus the cost thereof.

Thus, there has been shown and described an electronic package and method for making same wherein the resulting package includes, significantly, high density circuitry as part thereof while also assuring a thermal match between the package and associated external circuit structure on which it is positioned. Of further significance, the invention as produced herein is of relatively low profile. Still further, this package is attainable using at least two different forms of coupling between chip and associated circuitry, thus adding versatility to this important invention.

While there have been shown and described what are at present considered the preferred embodiments of the invention, it will be obvious to those skilled in the art that various changes and modifications may be made therein without departing from the scope of the invention as defined by the appended claims.

We claim:

1. An electronic package adapted for being electrically coupled to an electronic structure, said electronic package comprising:

a thermally conductive member;

a thin first dielectric layer of organic material positioned on said thermally conductive member;

at least one layer of electrical circuitry formed on said first thin dielectric layer and including a first portion having a first circuit density and a second portion including a second circuit density less than said first density, said first and second portions being electrically coupled;

a semiconductor device positioned relative to said first portion of said electrical circuitry and electrically coupled to said first portion;

a plurality of electrically conductive solder conductive members positioned in a predetermined pattern relative to said second portion of said electrical circuitry and electrically coupled to said second portion, said electrically conductive solder members adapted for being electrically coupled to said electronic structure when said electronic package is positioned on said structure; and a second thin dielectric layer of organic material positioned on selected regions of said layer of electrical circuitry and including openings therein, selected ones of said electrically conductive members being electrically coupled to said second portion of said electrical circuitry through said openings.

2. The package of claim 1 wherein said organic material for said first and second thin dielectric layers is comprised of polyimide.

3. The package of claim 1 wherein said first and second thin dielectric layers of organic material each possess a thickness of no greater than about 0.30 mils.

4. The package of claim 1 wherein said thermally conductive member is selected from the group consisting essentially of copper, aluminum or alloys thereof.

5. The package of claim 1 wherein each of said first and second portions of said electrical circuitry is comprised of a plurality of circuit pads.

6. The package of claim 1 further including a second plurality of electrically conductive members electrically coupling said semiconductor device to said first portion of said electrical circuitry.

7. The package of claim 1 wherein said thermally conductive member possesses a coefficient of thermal expansion substantially similar to the coefficient of thermal expansion of said electronic structure.

8. The package of claim 5 wherein selected ones of said pads of said first portion of said electrical circuitry are substantially cylindrical and possess a diameter of about 3 to about 4 mils and are spaced apart from one another a distance of about 8 to 10 mils on center-to-center spacings, said diameters and spacings defining said first circuitry density.

9. The package of claim 5 wherein selected ones of said pads of said first portion are of substantially rectangular configuration and possess a width of about 3 to 5 mils and are spaced apart a distance of about 7 to 9 mils on center-to-center spacings, said widths and spacings defining said first circuitry density.

10. The package of claim 8 wherein selected ones of said pads of said second portion of said electrical circuitry are of substantially cylindrical configuration and possess a diameter of about 14 to 18 mils and are spaced apart from one another a distance of from about 45 to 55 mils center-to-center spacings, said diameters and spacings defining said second circuitry density.

11. The package of claim 9 wherein selected ones of said pads of said second portion of said electrical circuitry are of substantially cylindrical configuration and possess a diameter of about 14 to 18 mils and are spaced apart from one another a distance of from about 45 to 55 mils center-to-center spacings, said diameters and spacings defining said second circuitry density.

12. The package of claim 6 wherein selected ones of said second plurality of electrically conductive members each comprise a solder element, said solder elements of said first plurality being larger than said solder elements of said second plurality.

13. The package of claim 11 wherein selected ones of said second plurality of electrically conductive members each comprises a wire.

14. The package of claim 12 wherein said selected ones of said first plurality of solder elements are comprised of 10:90 tin:lead solder material and selected ones of said second plurality of solder elements are comprised of 3:97 tin:lead solder material.

15. The package of claim 12 further including a quantity of encapsulant material substantially surrounding selected ones of said solder elements of said second plurality.

16. The package of claim 13 further including a quantity of encapsulant material covering said semiconductive device and said wires.

17. An electronic package assembly comprising:

a thermally conductive member;

a first thin dielectric layer of organic material positioned on said thermally conductive member;

at least one layer of electrical circuitry formed on said first thin dielectric layer and including a first portion having a first circuit density and a second portion including a second circuit density less than said first density, said first and second portions being electrically coupled;

a semiconductor device positioned relative to said first portion of said electrical circuitry and electrically coupled to said first portion;

a plurality of electrically conductive solder members positioned in a predetermined pattern relative to said second portion of said electrical circuitry and electrically coupled to said second portion;

a second thin dielectric layer of organic material positioned on selected regions of said layer of electrical circuitry and including openings therein, selected ones of said electrically conductive solder members being electrically coupled to said second portion of said electrical circuitry through said openings; and an electronic structure including a plurality of conductors, selected ones of said plurality of said electrically conductive solder members being electrically coupled to respective ones of said conductors.

18. An electronic package adapted for being electrically coupled to an electronic structure, said electronic package comprising:

a thermally conductive member;

a thin dielectric layer of organic material positioned on said thermally conductive member;

at least one layer of electrical circuitry formed on said thin dielectric layer and including a first portion having a first circuit density and a second portion including a second circuit density less than said first density, said first and second portions being electrically coupled;

a semiconductor device positioned relative to said first portion of said electrical circuitry and electrically coupled to said first portion;

a first plurality of electrically conductive solder conductive members positioned in a predetermined pattern relative to said second portion of said electrical circuitry and electrically coupled to said second portion, said electrically conductive solder members adapted for being electrically coupled to said electronic structure when said electronic package is positioned on said structure; and a second plurality of electrically conductive members electrically coupling said semiconductor device to said first portion of said electrical circuitry.

19. The package of claim 18 wherein selected ones of said second plurality of electrically conductive members each comprise a solder element, said solder elements of said first plurality being larger than said solder elements of said second plurality.

20. The package of claim 18 wherein selected ones of said second plurality of electrically conductive members each comprises a wire.

21. The package of claim 19 wherein said selected ones of said first plurality of solder elements are comprised of 10:90 tin:lead solder material and selected ones of said second plurality of solder elements are comprised of 3:97 tin:lead solder material.

22. The package of claim 19 further including a quantity of encapsulant material substantially surrounding selected ones of said solder elements of said second plurality.

23. The package of claim 20 further including a quantity of encapsulant material covering said semiconductive device and said wires.

* * * * *